United States Patent
Strauss

(10) Patent No.: US 6,995,978 B2
(45) Date of Patent: Feb. 7, 2006

(54) HOUSING WITH ACTIVE EXTERNAL COOLING AND AT LEAST ONE ELECTRONIC COMPONENT WITH HEAT-DISSIPATING CAPACITY

(75) Inventor: Hans-Ruediger Strauss, Lohr am Main (DE)

(73) Assignee: Rexroth Indramat GmbH, Lohr am Main (DE)

( * ) Notice: Subject to any disclaimer, the term of this patent is extended or adjusted under 35 U.S.C. 154(b) by 0 days.

(21) Appl. No.: 10/488,431

(22) PCT Filed: Sep. 3, 2002

(86) PCT No.: PCT/DE02/03236

§ 371 (c)(1),
(2), (4) Date: Aug. 6, 2004

(87) PCT Pub. No.: WO03/024176

PCT Pub. Date: Mar. 20, 2003

(65) Prior Publication Data
US 2004/0252460 A1 Dec. 16, 2004

(30) Foreign Application Priority Data
Sep. 6, 2001 (DE) ................................ 101 43 547

(51) Int. Cl.
*H05K 5/00* (2006.01)
(52) U.S. Cl. ...................... 361/688; 165/185; 338/280; 361/704
(58) Field of Classification Search ................ 361/678, 361/690, 691, 694, 695, 696, 697; 165/104.33, 165/121; 174/15.1, 17.05
See application file for complete search history.

(56) References Cited

U.S. PATENT DOCUMENTS

| 4,051,452 A | * | 9/1977 | Luy | ............................. 338/51 |
| 4,386,651 A | * | 6/1983 | Reinhard | ............... 165/104.33 |

(Continued)

FOREIGN PATENT DOCUMENTS

DE 81 30 651 U 5/1982

(Continued)

OTHER PUBLICATIONS

Patent Abstracts of Japan vol. 1998, No. 9, Jul. 31, 1998 & JP 10 108323 A Apr. 24, 1998.

*Primary Examiner*—Harold Joyce
(74) *Attorney, Agent, or Firm*—Michael J. Striker

(57) ABSTRACT

An actively externally cooled housing with at least one electronic component having heat-dissipating capacity, has a ventilation inlet located outside the housing, the ventilation inlet generating an airflow that is guided through a lateral flow channel, the flow channel being located on any side wall of the cooled housing on which at least one electronic component with heat-dissipating capacity is located, wherein the ventilation inlet is located in a ventilation housing that is located on the top side of the active-cooled housing and has a lateral air outlet that leads into the lateral flow channel, whereby an air intake occurs through only one air inlet opening that is located on the underside of the ventilation housing and which is essentially open vertically downward, so that the ventilation unit is located in the ventilation housing in such a manner that it is protected against impurities in the ambient air

20 Claims, 4 Drawing Sheets

U.S. PATENT DOCUMENTS

| | | | |
|---|---|---|---|
| 4,449,579 A * | 5/1984 | Miyazaki et al. | 165/104.33 |
| 4,790,373 A * | 12/1988 | Raynor et al. | 165/185 |
| 4,908,734 A | 3/1990 | Fujioka | |
| 5,045,831 A * | 9/1991 | Kiriloff et al. | 338/280 |
| 6,088,225 A * | 7/2000 | Parry et al. | 361/704 |
| 6,164,369 A * | 12/2000 | Stoller | 165/104.33 |
| 6,330,152 B1 * | 12/2001 | Vos et al. | 361/688 |
| 6,704,198 B2 * | 3/2004 | Replogle et al. | 361/690 |

FOREIGN PATENT DOCUMENTS

| | | |
|---|---|---|
| DE | 36 09 037 A1 | 10/1986 |
| DE | 37 10 556 A1 | 10/1988 |
| DE | 37 21 901 A1 | 1/1989 |
| DE | 298 23 425 U1 | 8/1999 |
| DE | 195 24 115 C2 | 3/2000 |
| EP | 0 297 308 A | 1/1989 |

* cited by examiner

HOUSING WITH ACTIVE EXTERNAL COOLING AND AT LEAST ONE ELECTRONIC COMPONENT WITH HEAT-DISSIPATING CAPACITY

BACKGROUND OF THE INVENTION

The present invention relates to a housing with active external cooling and at least one electronic component with heat-dissipating capacity.

An actively externally cooled housing of this nature has an electronic component with heat-dissipating capacity that is mounted on a side wall of the housing. The heat from power losses generated by this electronic component can be therefore dissipated largely via the corresponding side wall of the housing. A ventilation unit is provided outside the housing for this purpose, which generates an air flow that is directed through a lateral flow channel that flows directly over the stated side wall with the electronic component.

With the stated embodiment of the related art, essentially only the stated side wall is cooled, while the other sides of the housing practically remain uncooled, which results in very inhomogeneous cooling. This results in temperature hot spots, in particular on the top side of the housing, so that the performance of the electronic components contained therein is substantially limited by the stated geometry. In addition, the ventilation unit and/or its motor can become contaminated in the case of the stated embodiment, particularly when the housing is stationed in a production hall with unpurified ambient air.

SUMMARY OF THE INVENTION

The object of the present invention, therefore, is to further develop an actively externally cooled housing of the type mentioned initially in such a manner that, overall, with regard to the electronic componentry and the ventilation unit, improved, in particular longer, service intervals, even in environments with unpurified air and also an improved cooling capacity and thus a comparatively high electrical power for the electronic components in the housing can be achieved.

In the housing in accordance with the invention, the ventilation unit is located in a ventilation housing that is preferably separate from the housing. This ventilation housing is mounted on the top side of the actively cooled housing. The flow that is generated by the ventilation unit is such that it flows through an air inlet via an air inlet opening of the ventilation housing, the air inlet opening being located on the underside of the ventilation housing and being essentially open vertically downward. As a result, the ventilation unit is protected against impurities in the ambient air, in particular fluid droplets and larger, falling droplets and impurities.

After the air inlet, the cooling air passes through the ventilation housing and then through a lateral air outlet of the ventilation housing into a lateral flow channel.

As a result, the top side of the housing is effectively cooled in addition to the side wall with the electronic component with heat-dissipating capacity. This will be discussed in detail hereinbelow.

Due to the geometry, the ventilation unit is located such that it is practically protected against spraying water and/or the stated impurities/fluid droplets. As a result, the service life of the ventilation unit is also increased, since it is no longer acted upon to a great extent by impurities of this nature, unlike the related art.

To this end, the ventilation housing is closed practically on all sides, except for the stated air inlet opening. As a result, the air is drawn in from bottom to top through the air inlet opening located on the bottom, so that falling impurities are drawn in only minimally or practically not at all. This applies for spraying water in particular, which practically does not enter the ventilation housing at all and is therefore unable to come in contact with the ventilation unit. Due to the location of the air intake opening on the underside of the ventilation housing, a further advantage basically arises, namely that the air flow that is drawn in through this air intake opening can still blow past a housing wall and effectively cool it as well. This will be discussed in detail hereinbelow.

Preferred embodiments of the present invention are described in the subclaims.

In order to also cool, via intake air, the top side of the housing that is heated up by the warm air rising inside the device, and to further minimize the portion of impurities drawn in from the ambient air, it is provided that the ventilation housing covers at least part of the top side of the housing and that the air inlet opening is located essentially diametrically opposed to the housing top side, so that a gap is formed between the housing top side and the underside of the ventilation housing, via which the cooling air is largely drawn in. Preferably, practically the entire outline of the ventilation housing is diametrically opposed to, i.e., located over, the top side of the housing, so that it practically covers it entirely. The cooling air is drawn in through the gap that is formed, so that it is first directed upward, redirected in the ventilation housing and further directed vertically downward in the lateral channel. Due to this redirection effect of the cooling air flow, the ventilation unit is acted upon by impurities to a lesser extent, and fewer impurities are drawn into the lateral channel(s). As a result of this redirection, the comparatively heavy and preferably not suspended but rather falling droplets, such as spraying water, etc. are largely not carried along with the intake air and therefore remain outside the ventilation housing and/or the lateral channel. This is due primarily to the fact that the comparatively heavy particles are unable to follow the redirection due to the counteracting centrifugal force. In a preferred embodiment, in order to optimize the stated effects, the cooling air is therefore drawn in practically completely via the gap that forms between the housing top side and the underside of the ventilation housing.

It is essential that the gap geometry not result in excessive flow resistance, yet still result in a cooling effect of the housing top side. It is therefore provided that the effective intake cross-section of the gap geometry of the ventilator-housing arrangment is greater than or equal to the effective inlet cross-section of the air inlet opening. As a result, it is already ensured that the cooling air is actually drawn in largely via the gap and, simultaneously, that the flow path across the gap does not present excessive flow resistance, so that, overall, the efficiency of cooling is impaired only minimally or not at all.

It is further provided that the gap width is sized, with consideration for the operating point of the ventilator and the effective flow characteristics in the ventilation housing and the attached lateral flow channel, in such a manner that a cooling air flow results in the gap that effectively cools the housing surface. This is an essential condition for dissipating the heat from power losses that occurs on the housing top side and essentially originates inside the housing. The gap must not be too large. In experiments conducted by the applicant, a ratio of the intake cross-section of the gap (this is essentially the exposed opening of the gap circumference along the corresponding housing circumference) to the effective inlet cross-section of the air inlet opening of 1:1 to 3:1 delivered the best results. This means that the effective inlet cross-section of the gap geometry ranges from the same size to three times as large as the air inlet cross-section of the inlet opening.

The operating point of the ventilation unit must be taken into consideration as well. The greater the power of the ventilation unit, the greater the stated ratio. Simultaneously, a smaller ratio must be selected if there is greater flow resistance in the flow characteristics in the ventilation housing and connected lateral channel. "Greater" means the ratio in the upper range is from 1.5:1 to 3:1; "smaller" means the stated ratio is in a range from 1.5:1 to 1 or slightly below 1:1.

With the stated dimensions, which are merely guidelines, of course, and do not reflect all design options, a cooling air flow that effectively cools practically the entire top surface of the housing is indeed obtained.

By directing the air flow in the lateral flow channel essentially against the natural convection direction, i.e., vertically downward, very effective forced cooling is obtained, since the air in the upper region of the flow channel is still relatively cool, and the air in the lower region is relatively warmer. The cooling is therefore strongest in the upper region, which is exactly opposite to the case that would exist with natural convection.

The requirements for effective cooling are particularly high when the housing contains drive control electronics. The inventive teaching comes into play here, in particular: because, in drive control electronics, the required power electronic components can be located relatively easily on the corresponding side wall with the lateral channel, and cooling on multiple sides is an advantage particularly with a housing for drive control electronics because the power loss is very high and, for example, the top side of the housing receives a great deal of additional heat via the internal convection in the device housing. In addition, the service intervals for drive control electronics are very long; it is not unusual for drive control electronics to remain in practically uninterrupted operation for a very long period of time, during which it must generate power. Due to the advantageous embodiment of the cooling, the cooling effectiveness is also increased, while the overall output of a ventilation unit remains the same, and, simultaneously, a longer operating life for the ventilation unit and, therefore, for the drive control electronics is achieved. As such, the invention has dual use.

When electrical machines are driven using the drive control electronics, the corresponding electrical machines, e.g., electric motors, must also be braked. An electrical machine of this nature is braked occasionally or extensively and repeatedly, whereby the electric motor returns electrical energy in the form of voltage and/or current flow. A braking resistor is usually provided to dissipate energy that has been returned. When braking takes place, a great deal of heat from power losses is produced, depending on the number of revolutions and/or the speed of the connected electrical machine. This braking resistor can be mounted on the outside of the drive control electronics. The invention has a further synergistic effect and/or additional use when this braking resistor is located in the lateral flow channel in such a manner that the corresponding air flow flows around it. Air preferably flows around all sides of the braking resistor, but it is also usually sufficient if air flows only essentially longitudinally on a large area.

In any case, the air flow in the lateral flow channel is used simultaneously to cool the side wall and, therefore, the power electronics, and to cool the corresponding braking resistor. The braking resistor is preferably located such that there is space between it and the side wall to be cooled, so that no temperature hot spots develop between the braking resistor and the wall to be cooled, both of which would be heated up on both sides.

In order to permit effective dissipation of heat from the braking resistor, the braking resistor is preferably contained in an aluminum housing. The aluminum housing serves to keep any impurities in the cooling air flow away from the braking resistor, and to ensure good heat dissipation; aluminum has high thermal conductance, making it particularly well-suited for this application. An extruded profile section is preferably used, since the braking resistor is usually configured longitudinal in shape, and an extruded profile section fulfills the required geometric requirements for housing the braking resistor, and it has a longitudinal preferred direction, which allows it to be cooled effectively by the fact that air flows along it in a longitudinal direction.

To better dissipate heat, it is provided that the braking resistor contained in the aluminum housing has cooling ribs that extend practically in the local air circulation direction.

The electronic component(s) with heat-dissipating capacity are transistors, for example; IGBTs are usually used for this application in drive control technology.

In addition to the IGBTs used in drive control technology, other electronic components that generate a comparatively high level of electrical power loss are provided as well. They include capacitors, in particular capacitors for supporting a d.c. intermediate circuit. It has proven advantageous for these capacitors to be located in the upper region of the interior of the housing on any side wall over which the lateral air flow is directed by the lateral flow channel. It is preferable for the capacitors to be located in the upper third of the height of the housing. The cooling effect is greatest in the upper region of the forced cooling air flow, so it is preferable to locate the stated capacitors there, because these capacitors are usually very susceptible to the effects of heat. The location in the upper region, combined with the advantageous cooling geometry of the present invention, therefore increases the cooling capacity and the service life of the capacitors involved.

The invention will be described in greater detail with reference to the exemplary embodiment shown in the Figures.

DESCRIPTION OF THE PREFERRED EMBODIMENTS

Figure 1:
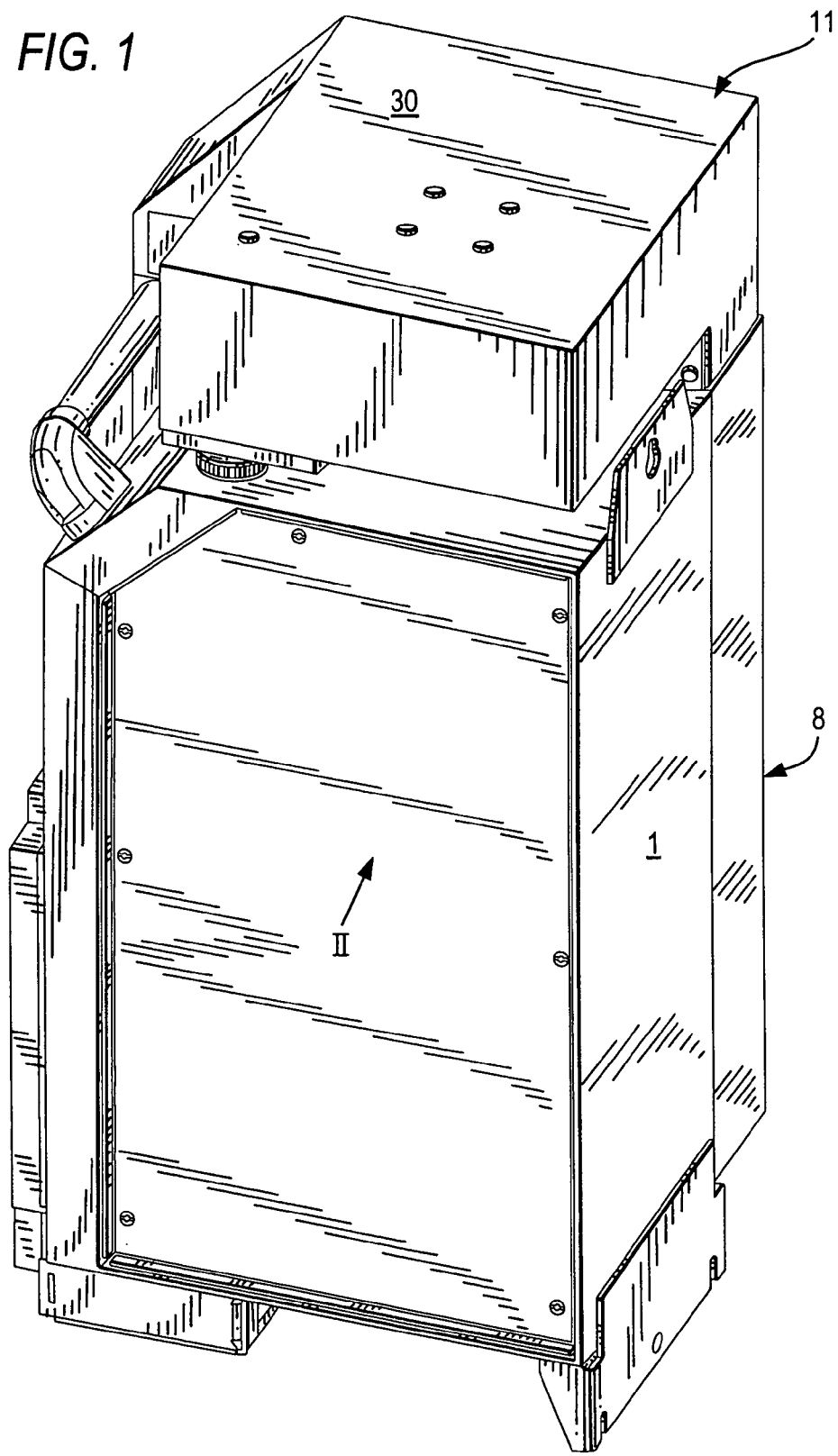
FIG. 1 is a perspective view of a housing with drive control electronics and a ventilation unit according to the invention.

Unless stated otherwise hereinbelow, all reference numerals apply for all Figures.

Figure 2:
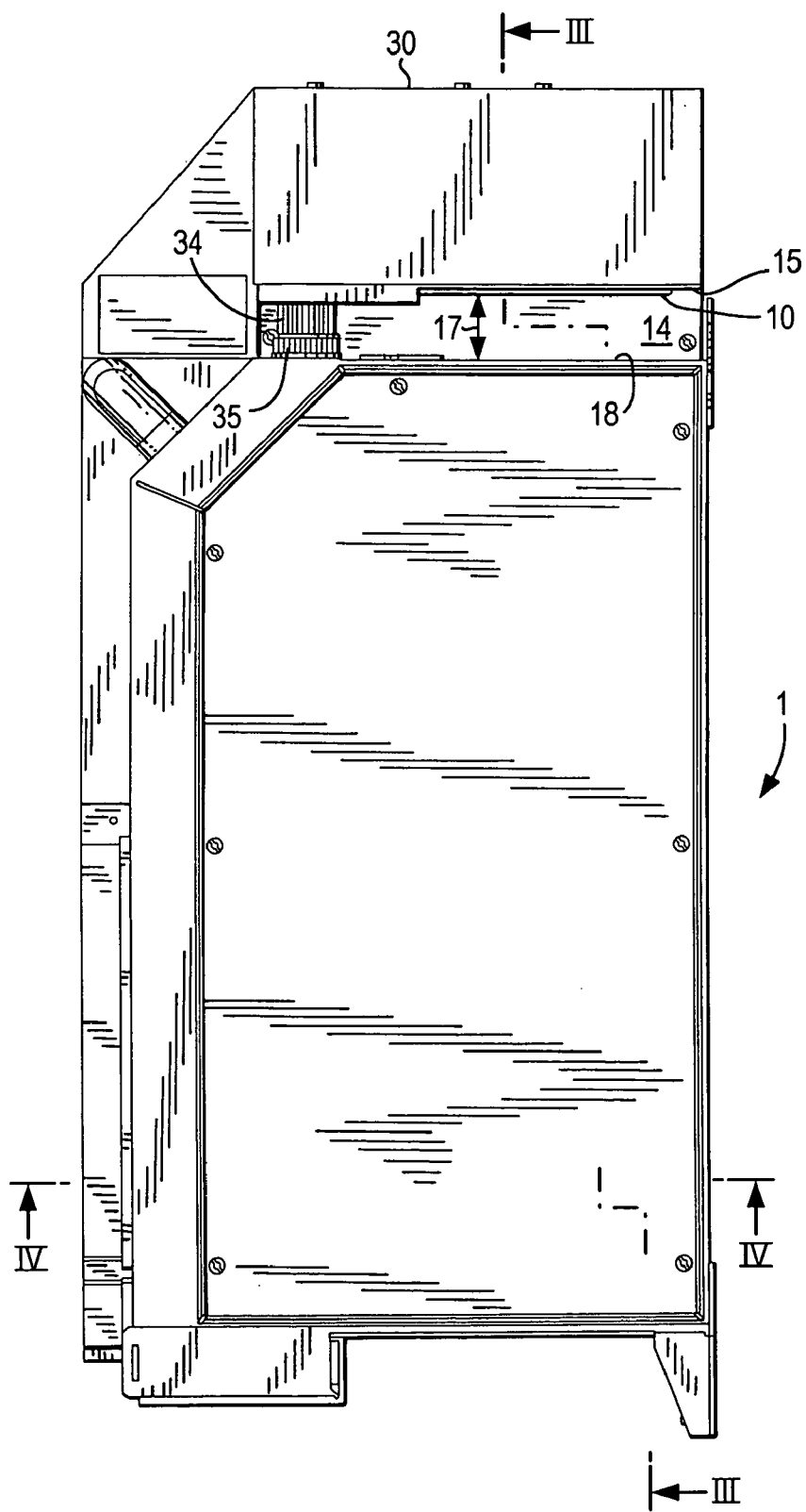
FIG. 2 is a side view of the device in FIG. 1, where it is indicated with the arrow II.
Figure 3:
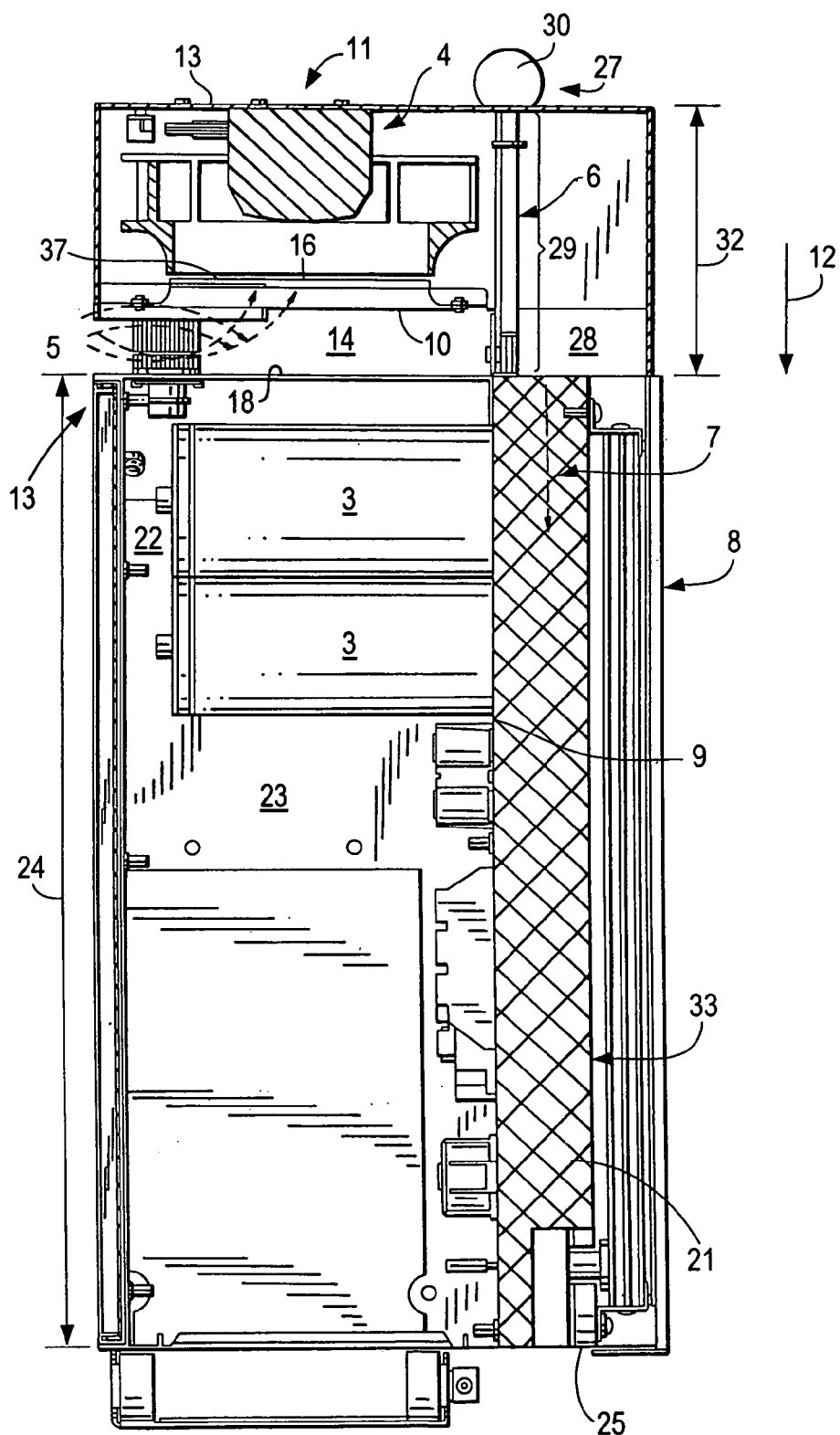
FIG. 3 is a cut along III—III shown in FIG. 2.

FIG. 1 is a perspective view of an actively externally cooled housing (1) with a cooling device according to the invention. Housing (1) has a plurality of electronic components (2,3) with heat-dissipating capacity; it is a drive housing, and the electronic components with heat-dissipating capacity are IGBTs (2) and capacitors (3), in particular to support a d.c. intermediate circuit. A ventilation unit (4) is located in a ventilation housing (11) that is located on top side (13) of actively cooled housing (1). The following description refers simultaneously to FIGS. 1 through 3.

Ventilation unit (4) is located in ventilation housing (11) and, In fact, on top side (13) of ventilation housing (11). It is screwed onto top side (13) with the four screws that are shown. Ventilation unit (4) and its fan wheel are located practically axially aligned with inlet cross-section (16) of an air inlet opening (10). The axial alignment with small clearance from air inlet opening (10) allows the cooling air to be effectively conveyed. Air inlet opening (10) is provided with a protective screen (37) on the bottom as protection against entry into ventilation housing (11). Ventilation housing (11) has a lateral air outlet that leads into a lateral flow channel (8) that is located on any side wall (9) of cooled housing (1) on which electronic components (2, 3) with heat-dissipating capacity are located. This side wall (9) is cooled particularly effectively as a result, and the heat is dissipated directly on the spot where it is produced. Capacitors (3) are located in upper region (22) of interior (23), so that they are protected from overheating via airflow (7)—across side wall (9)—and via the cooling of surface (18). It is essential that the air intake occur only through an air inlet opening (10) on the underside of ventilation housing (11), whereby air inlet opening (10) is also only open vertically downward (12), so that ventilation unit (4) is located in ventilation housing (11) in such a manner that it is protected against impurities in the ambient air. Overall, the geometry that is shown results in advantageous cooling that is also practically indifferent to falling impurities such as water spray. This is achieved only by way of simple geometric sizing and positioning: ventilation housing (11) is located above top side (18) of housing (1) to be actively cooled, and the underside of ventilation housing (1)—where air inlet opening (10) is located—is located diametrically opposed to top side (18). To this end, underside (15) of ventilation housing (11) and top side (18) of housing (1) overlap; this means that the outlines match and are practically aligned vertically. As a result, a gap (14) is produced between underside (15) and top side (18), via which the ambient air is drawn in. It is important that the geometry be laid out in such a manner that, overall, excessive flow resistance is not encountered when ambient air is drawn in, but that the speed at which ambient air is drawn in—at the point, in fact, where gap (14) transitions into the environment—does not become excessive; this ensures that impurities are drawn in only minimally or not at all.

In the exemplary embodiment shown, the effective inlet cross-section of the gap geometry of gap (14) is therefore larger than the effective outlet cross-section (16) of air inlet opening (10). The effective inlet cross section is essentially equal to the sum of the split planes (which are rectangular in this case) between the gap and the environment; in FIG. 2, for example, that is the rectangular area represented by gap (14) in the front view. In the exemplary embodiment shown, the effective inlet cross-section would therefore be equal to twice the stated area plus the area represented by gap (14) in the view in FIG. 3. That is the area that is perpendicular to the area in FIG. 2 mentioned hereinabove.

As indicated by arrow (5) representing cooling air flow in the area of gap (14), a flow results that effectively cools top side (18) of housing (1). To this end, gap width (17) is sized accordingly, with consideration for the operating point of ventilation unit (4) and the effective flow characteristics in ventilation housing (11) and attached lateral flow channel (8). Due to the fact that ventilation housing (11) and/or underside (10) of ventilation housing (11) and top side (18) of housing (1) overlap practically completely and/or are aligned with each other, practically the entire top side (18) of housing (1) is cooled effectively as well. This is a great advantage, because the heated air in the interior of housing (1) collects precisely in upper region (13) of housing (1), making cooling particularly effective here. Among other things, cooling convection in interior (23) of housing (1) is also promoted as a result. If additional air circulation (not shown here) is provided in interior (23), e.g., to prevent temperature hot spots, then additional, indirect cooling of practically the entire interior (23) is achieved. Overall, therefore, merely cooling top side (18) of housing (1) results in a substantial advantage that likely results in longer service life of capacitors (3) and likely enables greater electrical power of the drive control electronics overall given equal or comparable cooling capacity.

Nevertheless, the intake cooling air is not yet heated up to a great extent, so that housing side wall (9) and power electronic components (2, 3) mounted thereon are still cooled effectively via cooling rigs (21) that are enclosed in side channel (8).

Figure 4:
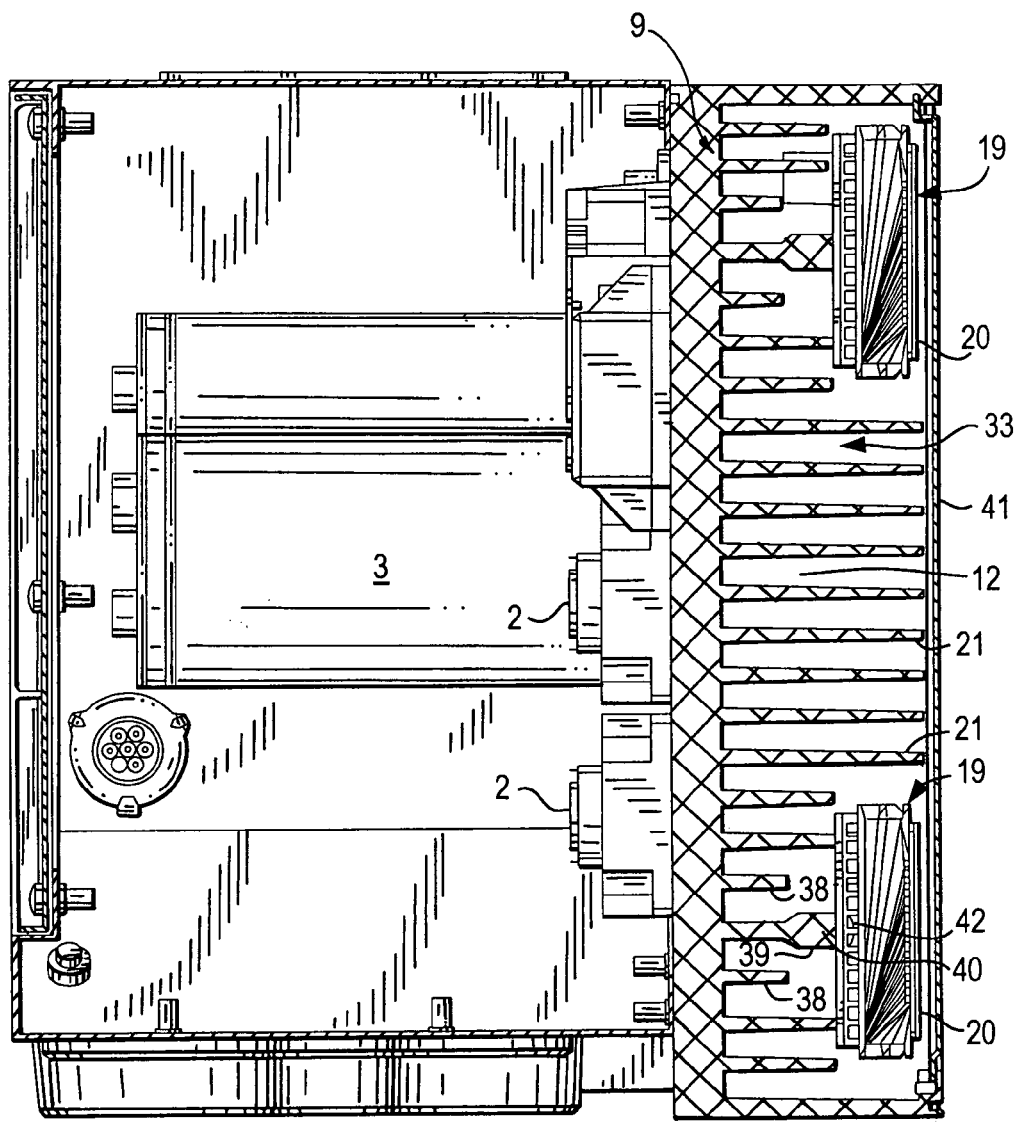
FIG. 4 is a cut along IV—IV shown in FIG. 2.

To this end, air flow (6) is redirected vertically downward (12), against the natural convection direction, to an air flow (7) that enters lateral flow channel (8) through an air inlet (26) and exits at a lower air outlet (25), whereby lateral flow channel (8) is closed around its circumference by an outer wall (41). The cooling effect of cooling air flow (7) through lateral flow channel (8) is also used to cool a braking resistor (19) via its housing (20), the braking resistor being mounted outside on the housing inside the—closed—lateral channel (8). Air flow (7) flows around this braking resistor. To improve cooling, the braking resistor has cooling fins (44) that extend practically in the local air circulation direction (in accordance with vertical direction (12); this is shown in FIG. 4. In the longitudinal region where the braking resistor is mounted, the cooling ribs of cooling body (33) are shortened to form cooling ribs (38), so that sufficient flow space remains between side wall (9) and braking resistor (19), so that side wall (9) and the particular braking resistor (19) are cooled. The top side of the cooling rib located in the middle is widened to form a mounting head (40), in which a screw (42) engages to hold braking resistor (19). The thick configuration of this mounting rib (39) ensures adequate strength.

Ventilation housing (11) is fixed to housing (1) via a long screw (27), the shaft (29) of which vertically extends practically through the entire height (32) of ventilation housing (11). Screw (27) is screwed into a corresponding fastening threaded hole (31) of housing (1) via its lower threaded section (28). On its top end, screw (27) has a knob (30) for actuation, loosening and/or tightening. The plug (34)-outlet (35) combination for electrically connecting the ventilation unit is sized in such a manner that a predetermined distance (17) (namely, the width of gap (14)) is maintained between housing top side (13) and underside of the ventilator housing (10). Simultaneously, the plug (34)-outlet (35) combination performs the function of supporting ventilation housing (11) on the top side (18) of housing (1). In this case, it provides an additional support area for the overhanging part of ventilation housing (11).

REFERENCE NUMERALS

1 Housing
2 Electric power switch
3 Capacitor
4 Ventilation unit
5 Air flow
6 Air flow
7 Air flow
8 Lateral flow channel
9 Side wall
10 Air inlet opening
11 Ventilation housing
12 Vertical direction
13 Housing top side
14 Gap
15 Underside of ventilation housing
16 Inlet cross-section
17 Gap width
18 Top housing surface
19 Braking resistor
20 Braking resistor housing
21 Cooling ribs
22 Upper region of the inside of the housing
23 Interior of the housing
25 Lower air outlet
26 Air intake of the lateral flow channel
27 Screw
28 Threaded section of the screw
29 Shaft section of the screw
30 Knob
32 Height of the ventilation housing
34 Plug
35 Outlet
36 Fan wheel
37 Protective screen
38 Short cooling ribs
39 Installation ribs
40 Installation rib head
41 Outer wall of the lateral flow channel
42 Screw for mounting the braking resistor

What is claimed is:

1. An actively externally cooled housing (1) with at least one electronic component (2, 3) having heat-dissipating capacity, comprising a ventilation inlet (4) located outside the housing (1), the ventilation inlet generating an airflow (5,6, 7) that is guided through a lateral flow channel (8), the flow channel being located on any side wall (9) of the cooled housing (1) on which at least one electronic component (2, 3) with heat-dissipating capacity is located,
   wherein the ventilation inlet (4) is located in a ventilation housing (11) that is located on the top side (13) of the active-cooled housing (1) and has a lateral air outlet that leads into the lateral flow channel (8), whereby an air intake occurs through only one air inlet opening (10) that is located on the underside of the ventilation housing (11) and which is essentially open vertically downward (12), so that the ventilation unit (4) is located in the ventilation housing (11) in such a manner that it is protected against impurities in the ambient air.

2. The actively externally cooled housing as recited in claim 1,
   wherein the ventilation housing (11) covers at least part of the housing top side (13), and the air inlet opening (10) is located essentially diametrically opposed to the housing top side (13), so that a gap (14) is formed between the housing top side (13) and the underside of the ventilation housing (11), via which the cooling air is largely drawn in.

3. The actively externally cooled housing as recited in claim 2,
   wherein the effective inlet cross-section of the gap geometry of the ventilation unit (4)-housing (1) arrangement is greater than or equal to the effective inlet cross-section (16) of the air inlet opening (10).

4. The actively externally cooled housing as recited in claim 2,
   wherein the gap width (17) is sized, with consideration for the operating point of the ventilation unit and the effective flow characteristics in the ventilation housing (11) and the attached lateral flow channel(8), in such a manner that a cooling air flow (5) results in the gap (14) that effectively cools the upper housing surface (18).

5. The actively externally cooled housing as in claim 1,
   wherein the air flow (7) through the lateral flow channel (8) is essentially directed vertically downward (12), against the natural convection direction.

6. The actively externally cooled housing as recited in claim 1,
   wherein the housing (1) contains drive control electronics.

7. The actively externally cooled housing as recited in claim 6,
   wherein a braking resistor (19) mounted outside the housing (1) is located in the lateral flow channel (8) in such a manner that the corresponding air flow (7) flows around it.

8. The actively externally cooled housing as recited in claim 7,
   wherein the braking resistor (19) is contained in an aluminum housing (20).

9. The actively externally cooled housing as recited in claim 8,
   wherein the aluminum housing (20) has cooling fins (44) that extend practically in the local air circulation direction.

10. The actively externally cooled housing as recited in claim 6,
    wherein capacitors (3) are located in the upper region (22) of the interior (21) of the housing (1) on any side wall (9) over which the lateral airflow (7) is directed by the lateral flow channel (8).

11. The actively externally cooled housing as recited in claim 10,
    wherein the capacitors (3) are located in the upper third of the height of the housing.

12. The actively externally cooled housing as recited in claim 1,
    wherein fastening component pairs (27) that are easy to access, loosen and tighten, for the joining and/or relative fixation in a form-locked manner of ventilation housing (11) and housing (11) are provided in a predetermined, aligned relative position of air outlet of the ventilation housing (11) in the lateral flow channel (8) and air inlet (26) of the lateral flow channel (8).

13. The actively externally cooled housing as recited in claim 12,
    wherein a long screw (27) is provided, the shaft (29) of which vertically extends practically through the entire height (32) of the ventilation housing (11) and is screwed into corresponding fastening threaded holes in the housing (1) and/or a cooling body (33), so that the ventilation housing (11) is fixed to the housing (1).

14. The actively externally cooled housing as recited in claim 1,
wherein a plug (34)-outlet (35) combination for electrically connecting the ventilation unit (4) is sized in such a manner that a predetermined distance (17) is maintained between the housing top side (13) and the underside of the ventilator housing, and/or the plug (34)-outlet (35) combination performs a function of supporting the ventilation housing (11) on the top side of the housing (1).

15. The actively externally cooled housing as recited in claim 1, wherein the ventilation unit (4) is located in the ventilation housing (11) in such a manner that it is protected against falling impurities.

16. The actively externally cooled housing as recited in claim 1, wherein the ventilation unit (4) is located in the ventilation housing (11) in such a manner that it is protected also against water spray in the ventilation housing (11).

17. The actively externally cooled housing as recited in claim 4, wherein the gap (17) is sized in such a manner that the cooling air flow (5) results in the gap (14) that effectively cools the entire top housing surface (18).

18. The actively externally cooled housing as recited in claim 8, wherein the breaking resistor (19) is contained in the aluminum housing (20) made out of an extruded profile section.

19. The actively externally cooled housing as recited in claim 10, wherein the capacitors (3) support a d.c. intermediate circuit and are located in the upper region (22) of the interior (21) of the housing (1) on any side wall (9) overwhich the lateral airflow (7) is directed by the lateral flow channel (8).

20. The actively cooled housing as recited in claim 12, wherein the fastening component parts (27) are provided in the predetermined, aligned relative position which is an installation position.

* * * * *